(12) United States Patent
Cusmai et al.

(10) Patent No.: US 9,166,540 B2
(45) Date of Patent: Oct. 20, 2015

(54) GAIN INVARIANT IMPEDANCE FEEDBACK AMPLIFIER

(71) Applicant: Broadcom Corporation, Irvine, CA (US)

(72) Inventors: Giuseppe Cusmai, Mission Viejo, CA (US); Vijayaramalingam Periasamy, Irvine, CA (US); Xi Chen, Irvine, CA (US); Ramon Alejandro Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 39 days.

(21) Appl. No.: 14/049,588

(22) Filed: Oct. 9, 2013

(65) Prior Publication Data

US 2015/0084690 A1    Mar. 26, 2015

Related U.S. Application Data

(60) Provisional application No. 61/881,902, filed on Sep. 24, 2013.

(51) Int. Cl.

| H03F 1/38 | (2006.01) |
|---|---|
| H03F 3/217 | (2006.01) |
| H03F 1/22 | (2006.01) |
| H03F 1/26 | (2006.01) |
| H03F 1/34 | (2006.01) |
| H03F 1/56 | (2006.01) |
| H03F 3/19 | (2006.01) |
| H03F 3/24 | (2006.01) |

(52) U.S. Cl.
CPC ............... *H03F 3/2171* (2013.01); *H03F 1/22* (2013.01); *H03F 1/26* (2013.01); *H03F 1/34* (2013.01); *H03F 1/56* (2013.01); *H03F 3/19* (2013.01); *H03F 3/245* (2013.01); *H03F 2200/123* (2013.01); *H03F 2200/151* (2013.01); *H03F 2200/498* (2013.01)

(58) Field of Classification Search
CPC ........................................................ H03F 1/38
USPC ............................................ 330/291, 260, 82
See application file for complete search history.

(56) References Cited

U.S. PATENT DOCUMENTS

| 4,710,727 | A | * | 12/1987 | Rutt | ............................... 330/110 |
|---|---|---|---|---|---|
| 6,255,889 | B1 | * | 7/2001 | Branson | ........................ 327/359 |
| 6,396,330 | B1 | * | 5/2002 | Fujii | ............................. 327/355 |
| 6,696,898 | B1 | * | 2/2004 | Ward et al. | ............... 331/116 FE |
| 7,759,988 | B2 | * | 7/2010 | Lu et al. | ........................ 327/119 |

OTHER PUBLICATIONS

Xiao, Jianhong, et al., A High Dynamic Range CMOS Variable Gain Amplifier for Mobile DTV Tuner, IEEE Journal of Solid-State Circuits, vol. 42, No. 2, Feb. 2007, 10 pages.

* cited by examiner

*Primary Examiner* — Henry Choe
(74) *Attorney, Agent, or Firm* — Brinks Gilson & Lione (57) ABSTRACT

A system includes a weighting element, a transconductance circuit, a feedback loop, and an auxiliary loop. In some implementations, the transconductance circuit may accept an input and provide a first portion of an output for amplification at a variable amplification level to generate an amplifier output. The feedback loop may provide a portion of the amplifier output as a first feedback to the input. The first feedback may be associated with an impedance that may vary with the amplification level. The auxiliary loop may provide a second feedback to the input to reduce the dependence of the impedance on the amplification level.

20 Claims, 7 Drawing Sheets

GAIN INVARIANT IMPEDANCE FEEDBACK AMPLIFIER

PRIORITY CLAIM

This application claims priority to U.S. Provisional Application Ser. No. 61/881,902, filed Sep. 24, 2013, which is incorporated herein by reference in its entirety.

TECHNICAL FIELD

This disclosure relates to feedback amplifiers, and reducing impedance variation across an amplifier gain spectrum.

BACKGROUND

Amplifiers accept an input and increase its magnitude to generate an output. Amplifiers may be implemented in systems where a received signal from a first portion of the system is insufficient to support operation of a second portion of the system. For example, a received wireless transmission may be at a signal level that is too low for signal processing circuits to properly decode; an amplifier may be implemented to boost the signal to an operable level. In some cases, amplifiers may increase the noise level associated with a signal and may reduce the signal-to-noise ratio. The level of noise increase may increase with the level of amplification. Flexible amplification solutions that are robust to noise may be desirable.

BRIEF DESCRIPTION OF THE DRAWINGS

FIG. 3 shows an example AS.
FIG. 4 shows an example bi-polar junction transistor AS.
FIG. 5 shows an example field effect transistor AS.
FIG. 7 shows an example AS.

DETAILED DESCRIPTION

The disclosure below concerns techniques and architectures for reducing impedance variation across an amplifier gain spectrum. In some implementation, the techniques and architectures may facilitate amplification level independent impedance for an amplifier with a continuously variable amplification level. Additionally or alternatively, amplification level independent impedance may be achieved in discrete amplification-level amplifiers. Accordingly the example device described below provides an example context for explaining the amplification level independent impedance techniques and architectures.

Figure 1:
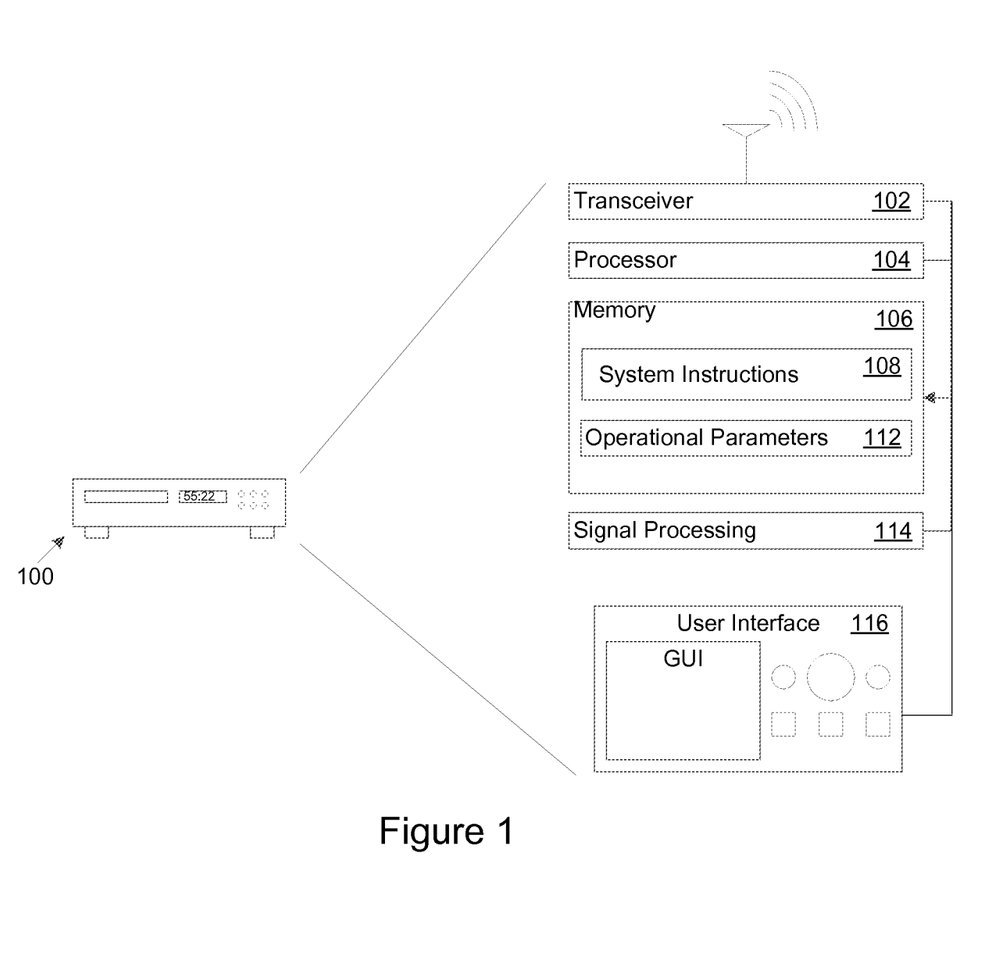
FIG. 1 is a functional block diagram of an example device.

FIG. 1 shows an example device 100. In one example, the device may be a communication device, such as a cable or satellite television set-top boxes (STBs), or cellular telephone. However, the device may be virtually any device implementing internal bus communications. For example, portable gaming system or tablet may use such amplification circuits.

The device 100 may include transceiver elements 102 to support RF communication, one or more processors 104 to support execution of applications and general operation of the device. The device 100 may include memory 106 for execution support and storage of system instructions 108 and operation parameters 112. Signal processing hardware 114 (e.g. ADC, baseband processors etc.) may also be included to support transmission and reception of signals. The signal processing hardware may include amplifiers to adjust input signal levels to useable output levels. For example, an application specific component (e.g. a global positioning system (GPS) chip, a demodulator, or other application specific component) may use a determined input level. In some case, an amplifier in an automatic gain control circuit may provide an output at a constant time-averaged level, e.g. at the determined level. The communication device may include a user interface 116 to allow for user operation of the device.

Figure 2:
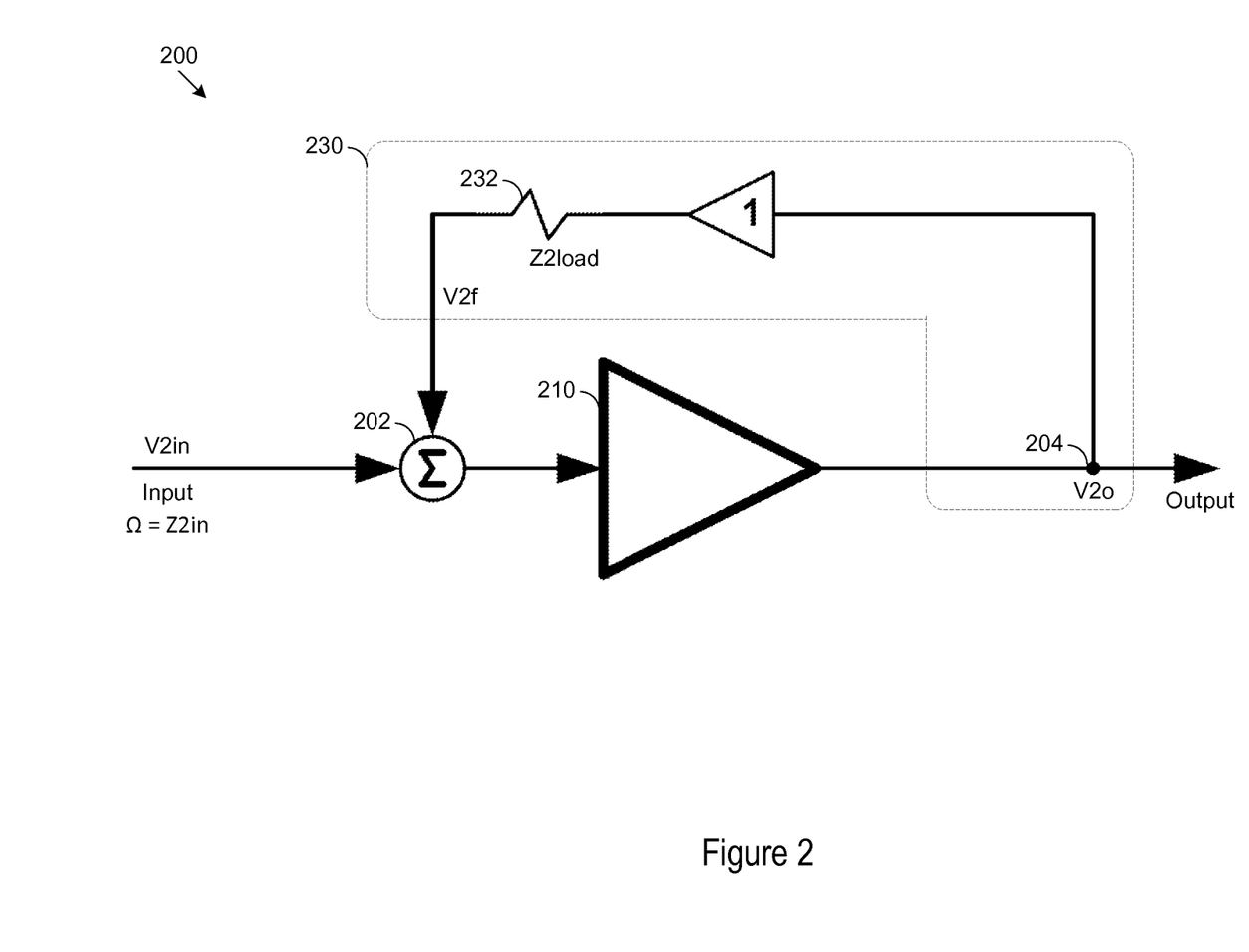
FIG. 2 shows an example amplifier system (AS).

FIG. 2 shows an example amplifier system (AS) 200. The AS 200 may include an amplifier circuit 210 and a feedback loop 230. The amplifier circuit may accept an input to the AS 200 (V2in) at the summer 202 which is amplified by the amplifier circuit to a determined amplification level. In some cases, an amplification level may be described using a gain factor. For the example amplifier circuit, the gain factor is A where:

$$A = 10 \cdot \log\left(\frac{Pout}{Pin}\right) \quad \text{Equation 1}$$

Where Pout is the output power of the AS 200, and Pin is the input power to the AS 200.

The signal exiting the amplifier circuit 200 may be divided into two parts at junction 204: a feedback and the output of the AS 200. The feedback travels along the feedback loop 230. The feedback may also traverse resistor 232. The voltage at junction 204 (V2o) may be greater than the input voltage, because of the amplification. Current may flow along the feedback loop from the junction 204 to the summer 202. The resistor 232 may have an associated voltage drop. The voltage provided to the summer 202 by the feedback loop 230 (V2f) may be lower than the voltage at junction 212 (V2in). In some implementations, the summer 202 may remove the V2f from V2in to generate the signal into the amplifier circuit 210 (V2a). For example the AS 200 may be a negative feedback system. In various implementations, the summer 202 may additively combine V2f and V2in. For example, AS 200 may be a positive feedback system.

In some cases, the feedback may contribute to the current flow at the summer 202. For a given value of V2in, the current due the feedback may vary with the amplification level of the AS 200. Given the V=IR the input impedance (Z2in) of the AS 200 must also vary with the amplification level, if V2in is held constant. For example, if voltage is constant and impedance may increase for a system when current decreases. For some negative feedback implementations, the input impedance Z2in of the AS 200 may be represented as:

$$Z2in = \frac{Z2load}{1 + A} \quad \text{Equation 2}$$

Where Z2load is the resistance of the resistor 232 and A is the gain factor associated with the gain of the AS 200. Varying the input impedance of the AS 200 may lead to reflections, insertion loss, and/or other sources of noise or distortion. in some cases, it may be advantageous to implement an AS with amplification level independent impedance. Alternatively or additionally, techniques for reducing the dependence of the impedance on the amplification level may be advantageously implemented in an AS.

Figure 3:
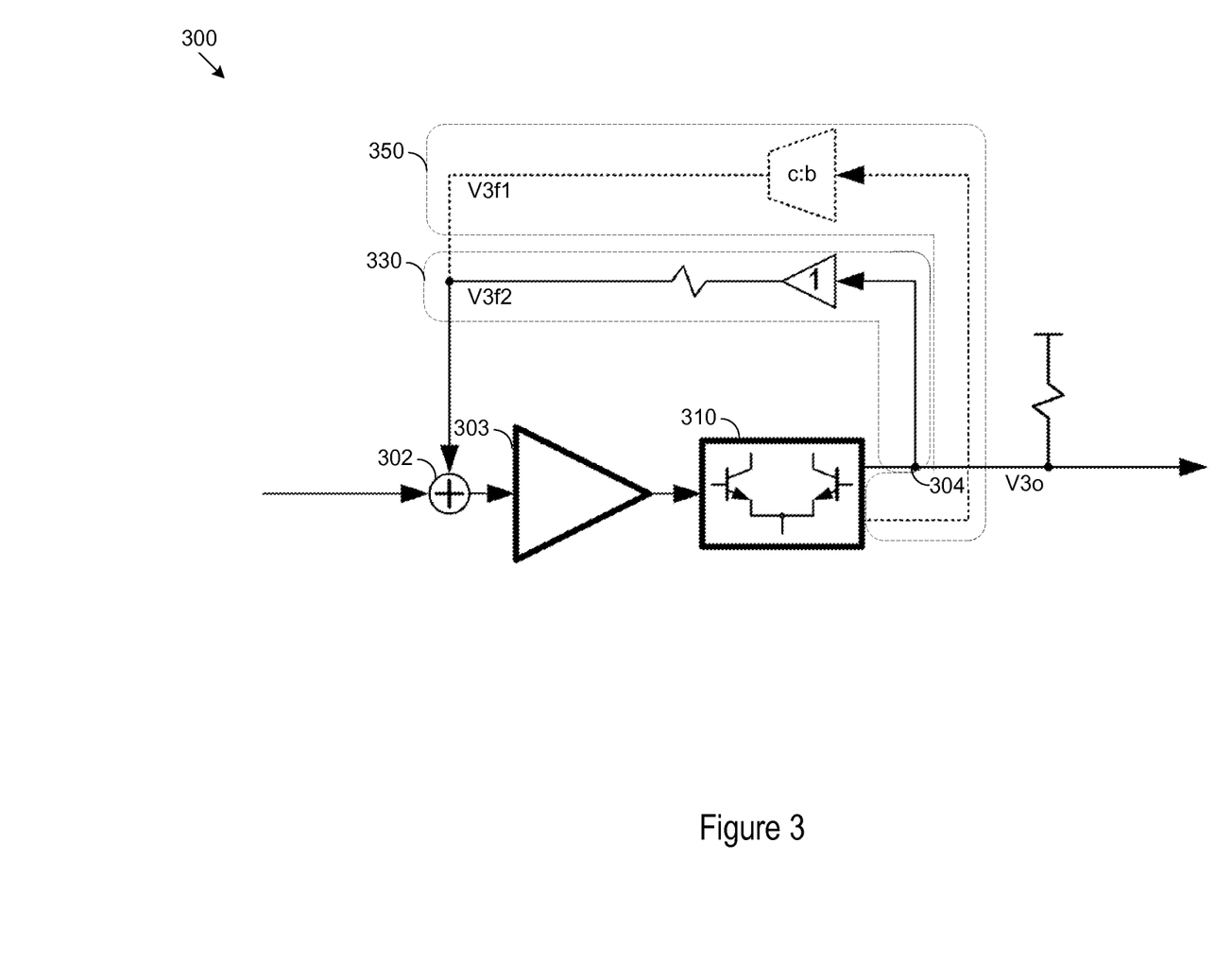

FIG. 3 shows an example AS 300. The AS 300 includes a transconductance circuit 303, weighting element 310, a feedback loop 330, and an auxiliary loop 350. The feedback loop 330 provides a first feedback V3f1 to the summer 302, and the auxiliary loop 350 provides a second feedback V3f2 to the summer 302. The first feedback is split-off from the output (V3o) at junction 304. In some implementations, the second feedback may originate from a second portion split-off using a weighting element 310 following transconductance circuit 303. A relationship between a first portion of the current out of the amplifier and the second portion may depend of relative weights applied to the AS 300 output and the auxiliary loop 350. The weighting element may act as a current steering device and determine the amplification level and second feedback via control signals. For example, the weighting element 310 may include transistors. The transistors may be made up of parallel finger elements, e.g. unitary transistor elements. The weight between transistors made up of the fingers may be dependent on their relative numbers of fingers. The transistors in the amplifier circuit may be weighted to a factor c. The auxiliary loop may be weighted to a factor of b. In some cases, b may be determined by c and a determined input impedance. For example, for an amplification level proportional to c may cause a first feedback that is a function of b from the feedback loop 330. If the amplification level is reduced to zero for the same input signal to the AS 300, second feedback that is the function of b may still be provided to facilitate constant impedance. In the example, scenario the input signal, e.g. voltage, has not changed. If the impedance, e.g. resistance, is to remain constant, the first and second feedback, e.g. the current, may also remain constant. If the first feedback is reduced to zero, the second feedback may then be equal to the function of b.

Weighting element 310 may include transistors made up of finger elements such that the second feedback is a function of b(1−GC) where GC is the gain control and varies from 1 to zero. A GC of 1 is associated with the highest amplification level and a GC of zero is associated with no amplification. In some cases, an amplification circuit may have a non-zero, e.g. positive or negative, minimum amplification level. In some implementations, the difference between the first feedback for the maximum amplification level and the first feedback for the minimum amplification level may be the function of b. The second feedback may supply the difference between first feedback at the maximum level and the first feedback at the current level for the amplification level range. If weighting element 310 steers current to the output, resulting in an effective amplification level of GC, then weighting element 310 may steer second feedback that is a function of b(1−GC) to the input.

In some implementations, the value at which the input impedance of the AS 300 is held constant may be adjusted, e.g. by control logic within the AS 300 or via received signals. For example, the transistors in the weighting element 310 may include switchable finger elements. By switching finger elements in or out the relative weights of the second feedback and amplification level may be adjusted. Further, absolute weights may also be adjusted. Relative and/or absolute weights may be used to vary the value at which the constant impedance is held.

In various implementations, the weighting and current steering functionality of the weighting element 310 may be performed by components present in the transconductance circuit 303 and/or the auxiliary loop 350.

Figure 4:
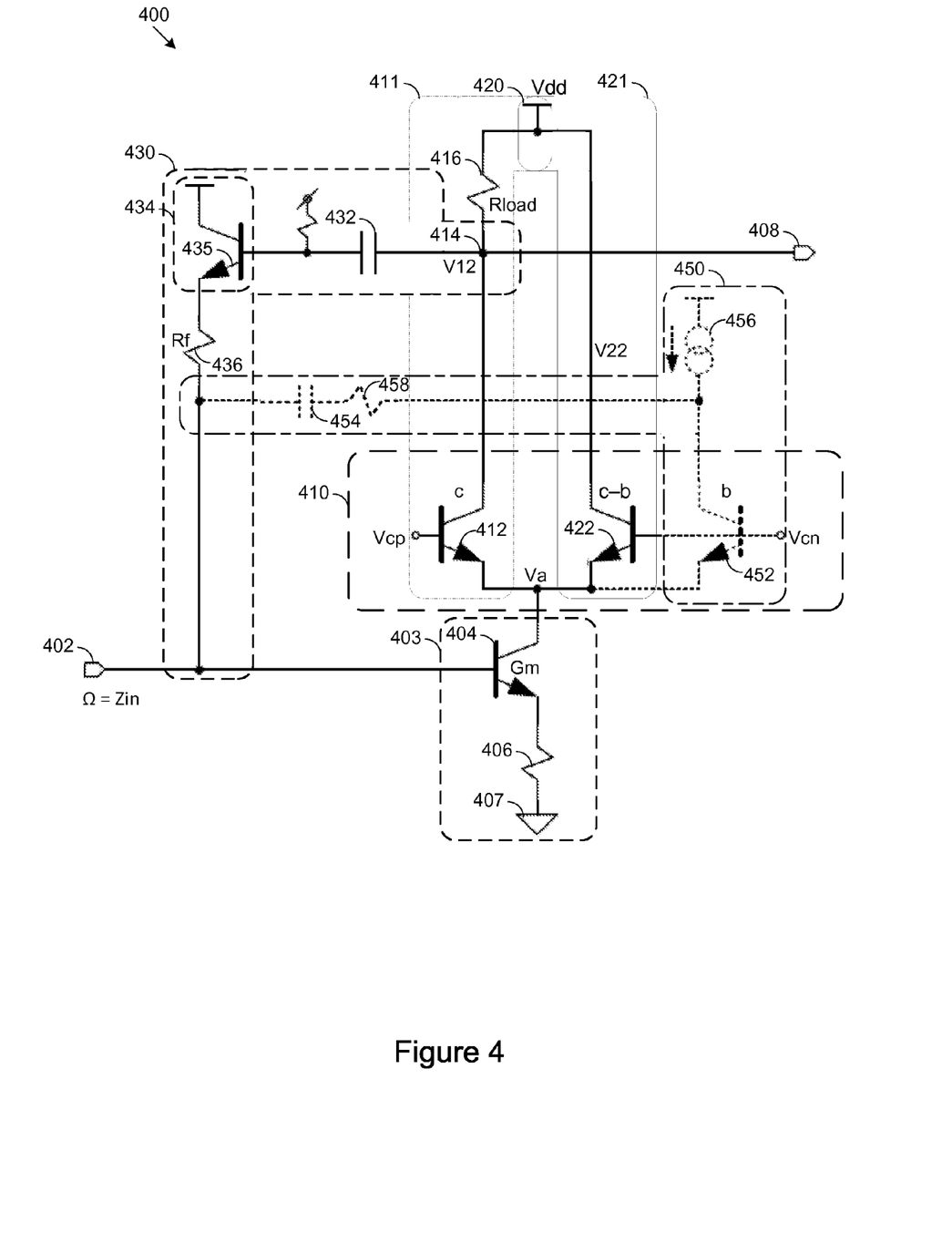

FIG. 4 shows an example bi-polar junction transistor (BJT) AS 400. The BJT AS 400 may include an input 402, a transconductance circuit 403, an output 408, a weighting element 410, a feedback loop 430 and an auxiliary loop 450. The amplification level of the BJT AS 400 may be described by a gain factor A represented by Equation 1 where Pin is the power at the input 402 of the BJT AS 400 and Pout is the power at the output 408 of the BJT AS 400.

Transconductance circuit 403 may include transistor 404, Emitter resistor 406, and a ground 407. In various implementations, transconductance circuit 403 may function as a common emitter amplifier when complemented by a load resistor and voltage supply. In some cases, a common emitter amplifier may produce an inverted output. Contributions from feedback loop 430 and auxiliary loop 450 may be based on the inverted output. In some cases, the contributions from feedback loop 430 and auxiliary loop 450 may combine subtractively with the input 402.

The weighting element 410 splits the output (Va) of transconductance circuit into three portions. The first portion may be controlled by a first transistor 412 and coupled to the, junction 414 feedback loop 430, the output 408, load resistor 416 and supply 420. The second portion may be controlled by a second transistor 422 and may be coupled to the supply 420. The auxiliary portion is split off for transistor 452 on the auxiliary loop.

In various implementations, the relative weights of transistors 412, 422, and 452 may be set in a ratio of c, c-b, and b, respectively. The weights may be implemented by constructing transistors 412, 422, and 452 of parallel finger elements according the above ratio. The difference in weight between transistors 412 and 422 may be equal to the weight of transistor 452.

The BJT AS 400 includes paths 411, 421. Transistor 412 may be one end of path 411, and transistor 422 may be one end path 421. The supply 420 forms the other end of the paths 411, 421.

Path 411 may further include junction 414 and resistor 416. Junction 414 may couple path 411, and the output of transistor 412, to the feedback loop 430 and output 408. Coupling path 411 to transconductance circuit 403 may allow transconductance circuit 403 to act as a common emitter amplifier. The resistance (Rload) of resistor 416 allows for a voltage difference between the output (V12) of transistor 412 and the supply 420 voltage (Vdd), e.g. resistor 416 may allow for a voltage drop. Between resistor 416 and transistor 412 the voltage may be determined by the amplification level. The weighting element may include control signals Vcp and Vcn. Vcp may be used to control the amplification level. Vcp may be used to determine the first portion of Va through transistor 412.

Path 421 may couple the output (V22) of transistor 422 to the supply 420. The supply 420 may hold V22 at Vdd. The supply 420 may accept or supply current to hold V22 at Vdd. Path 421 may lack a load resistor and transconductance circuit 403 may not act as an amplifier.

In some cases a load resistor may be placed on path 421 between the transistor 422 and the supply 420. This may result in transconductance circuit 403 acting as a common emitter amplifier along path 422. V22 may become large for large amplitude input signals at low amplification levels. V22 may not be coupled to an output. In some cases, a large V22 without coupling to an output or supply may be associated with damage to the BJT AS 400. For example, break down may occur. In some cases, V22 may be coupled to an auxiliary feedback loop. A auxiliary feedback loop may not support current flow to avoid damage associated with a large V22 value. For example an auxiliary feedback loop may include a large resistor or high-impedance voltage buffer which may inhibit current flow. In some cases, a maximum input voltage may be defined for the BJT AS 400 to avoid damage. Ladder input elements may be used to attenuate large input signals to avoid high values of V22. Input signal lost to attenuation prior to amplification may be associated with an increased noise figure for the BJT AS 400. In some cases, it may be advantageous to omit a load resistor between the transistor 422 and the supply 420. Omitting such a resistor, or a portion the resistance, may reduce voltage buildup and increase the range of inputs acceptable to the BJT AS 400.

Vcn controls the base of transistors 422 and 452. Vcp and Vcn may control the same weight of transistors. The sum of the weights of transistors 452 and 422 may be equal to the weight of 412. For equal values of Vcp and Vcn, the first portion of the input though transistor 412 may be equal to the sum of the second portion and the third portion of the input through transistors 422 and 452, respectively. In some implementations, Vcp and Vcn may be complementary signals. For example, Vcp may vary over a range and Vcn may vary over a range. When Vcp is at the top of its range, Vcn may be at the bottom of its range or vice versa. Vcp and Vcn may vary accordingly, for example when Vcp is at 80% of its maximum Vcn may be at 20% of its maximum, or other complementary values.

In various implementations, the output of transistor 422 may be lost to the supply 420, and the output of transistor 412 is coupled to the output 408 and the feedback loop 430. The output of transistor 412 may be associated with the amplification level. When Vcp is high the amplification level may be high and Vcn may be low. When the amplification level is high, the voltage at junction 414 may be high and the first feedback to the input may be high. When Vcn is low, the third portion of the input through 452 may be low and the second feedback to the input may be low. When Vcp is low, Vcn may be high and the amplification level may be low. When the amplification level is low, the voltage at junction 414 may be low and the first feedback to the input may be low. When Vcn is high, the third portion of the input through 452 may be high and the second feedback to the input may be high. In some implementations, for a constant input signal the combined effect, e.g. sum, of the first and second feedback may be constant for differing values of Vcp and Vcn.

In various implementations, feedback loop 430 may have one end at junction 414 and a second end at junction 406. The feedback loop 430 may include components to facilitate delivery of the second feedback. The feedback loop may include capacitor 432. In various implementations, capacitor 432 may function as a high-pass filter and may block a direct current (DC) signal that may be present on the feedback loop 430. In some cases, the feedback loop may include a voltage buffer 434 to make the feedback loop act as a pass the voltage from junction 414, and not pass current from 414. The feedback loop 430 may also include resistor 436 with a resistance Rf. Resistor 436 may cause a voltage drop. A portion of the voltage at junction 414 may then be present on the opposite side of resistor 416. As discussed above that portion may be a function of b for a maximum amplification level.

In some implementations, the auxiliary loop may include a capacitor 454 which may function as a high-pass filter and may block a DC signal that may be present on the auxiliary loop 450. A current source 456 may be used to bias the auxiliary loop. The transistor 452 may use a DC current supplied by current source 456. The auxiliary loop may act as an open circuit for DC current because of capacitor 454. The current source 456 may allow DC current to flow to transistor 452. The current supplied by current source 456 may not be fixed. In some cases the current may vary with Vcn. In some implementations, the current source may be implemented as an inductor or choke. An inductor may act as an open or high impedance circuit to radio frequency (RF) signals. In some cases, RF signals may not be affected by the presence of current source 456. Auxiliary loop 450 may also include resistor 458. Resistor 458 may be used to reduce a voltage swing that may occur at the output of transistor 452 Vaux. The input to the AS 400 may be large. The resistor 458 may allow Vaux to be smaller than the signal at the input. In some cases resistor 458 may not affect the current flowing through the auxiliary loop. The auxiliary loop 450 may operate by supplying current to the input. The operation of the auxiliary loop in current mode may cause voltage build up and damage may be mitigated. Ladder input elements may not be used and large signal inputs may not be attenuated.

Figure 5:
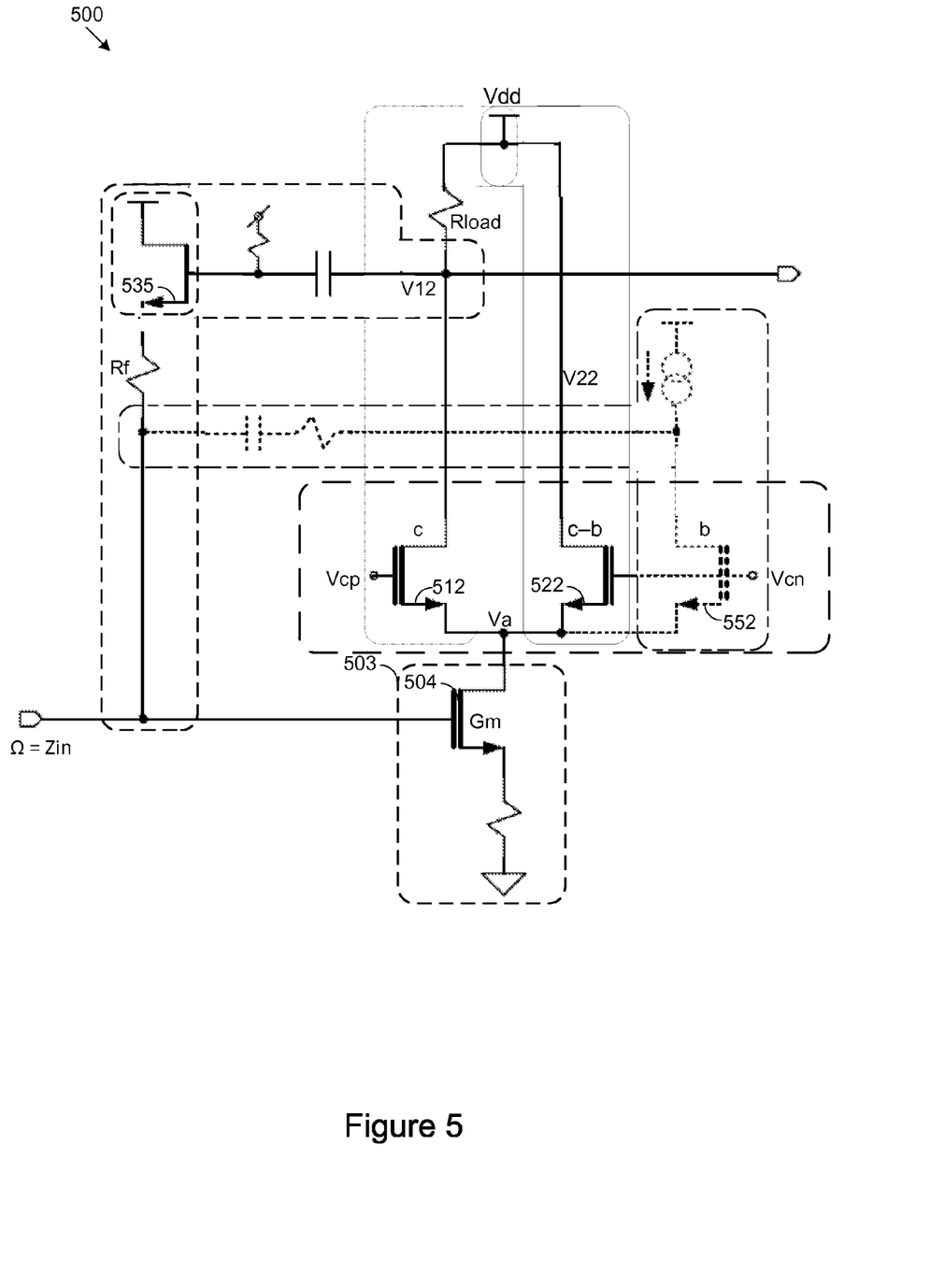

Transistors 404, 412, 422, and 452 and the transistor of voltage buffer 434 may be implemented as field effect transistors (FETs). FIG. 5 shows an example FET AS 500. In the example FET AS 500, BJT transistors 404, 412, 422, and 452 and the BJT transistor 435 of voltage buffer 434 are implemented as FET transistors 504, 512, 522, 552, and 535, respectively. The example FET AS 500 may be functionally similar to example BJT AS 400. When complemented by a load resistor and supply, transconductance circuit 503 of FIG. 5 may act as a common source amplifier. In some implementations, a common source amplifier may produce an inverted output.

In various implementations, FET and BJT transistors may be implemented. For example, referring to FIG. 4, transistors 403 and/or 435 may be implemented as BJT transistors the remaining transistor may be implemented a FETs, or vice versa. In some cases, finger elements of transistors 412, 422, and 452 may include BJT and FET transistors. In some cases, separate ratios of c, c-b, and b may be maintained independently for the BJT and FET finger elements. For example, the BJT finger elements are arranged in a ratio of c, c-b, and b, and the FET finger elements are arranged in a ratio of c, c-b, and b.

In various implementations, the BJT AS 400 may be implemented with npn transistors. FET AS 500 may be implemented with nmos transistors. In some cases, combinations of nmos and npn transistors may be implemented.

Alternatively or additionally, pmos and pnp transistors may be implemented. In some cases, the polarity of voltages in a pmos/pnp implementation may be inverted. The positions of supply 420 and ground 407 may be switch: supply 420 may be situated at the position ground 407 and vice versa.

Figure 6:
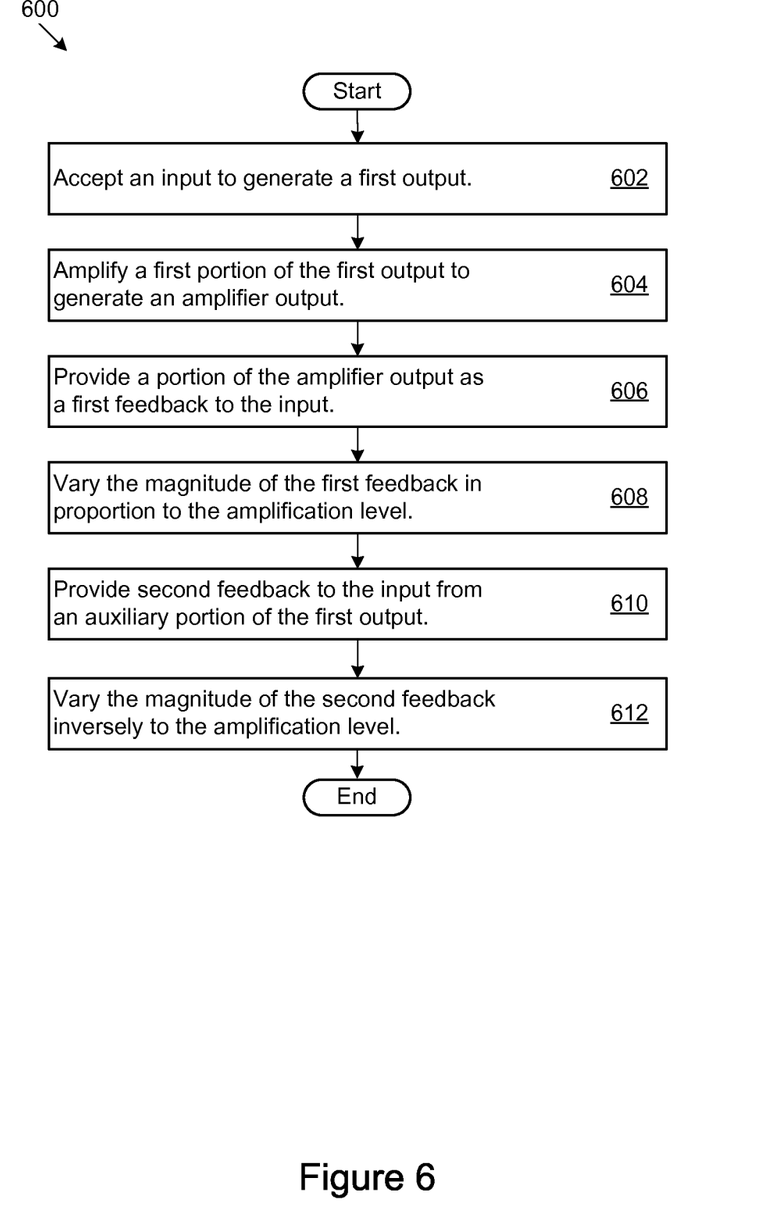
FIG. 6 shows example logic for maintaining amplification level independent impedance.

FIG. 6 shows example logic 600 for maintaining amplification level independent impedance. A transconductance circuit, e.g. 303, 403, may accept an input to generate a first output (602).

The amplifier circuit or transconductance circuit and a first path of a weighting element may amplify a first portion of the first output to generate an amplifier output (604). In some cases, an amplification level may be defined by the relationship between the input and amplifier output powers, as shown in Equation 1. In some cases, the first portion may not be the entire first output. The first portion may be dependent on the weighting ratio of c and b. In cases where, the entire first output may not be amplified, the amplification level may still be defined by using the entire input and amplifier output.

A feedback loop, e.g. 330, 430, may provide a portion of the amplifier output as a first feedback to the input (606). In various implementations, the first feedback may be combined with the input additively or subtractively.

The magnitude of the first feedback may depend on the amplifier output, which may be dependent on the amplification level. The magnitude of the first feedback may be varied in proportion to the amplification level (608), which may be controlled via control voltages supplied by logic 600 or via external control inputs.

An auxiliary loop may provide a second feedback to the input from an auxiliary portion of the first output (610). The auxiliary portion may be dependent on the weighting ratio of c and b, where c determines the first portion which is amplified and b determines the auxiliary portion that contributes the second feedback.

The logic 600 may vary the magnitude of the second feedback inversely to the amplification level (612). Varying the second feedback inversely to the amplification level may allow for the second feedback to counter the varying of the first feedback proportionally to the amplification level. In some implementations the sum of the first and second feedback may be independent of the amplification level.

Referring again to FIG. 4, at maximum gain, transistor 412 of the weighting element 410 delivers the transconductance output (Gm) of the transconductance circuit 403 to the load resistance Rload and the input impedance is set by the feedback loop 430:

$$Zin \approx \frac{Rf}{1 + Gm \cdot Rload} \quad \text{Equation 3}$$

In the absence of the auxiliary loop 450, the input impedance may vary as current is steered based on Vcp and Vcn. In the presence of the auxiliary loop 450 a small fraction of Ia is provided as second feedback, and Zin, at minimum gain, may be represented by:

$$Zin \approx \frac{c}{b \cdot Gm} \quad \text{Equation 4}$$

The ratio of c and b may be selected to set the two values of Zin. For intermediate values of Vcp and Vcn, Equations 3 and 4 form the terms of Zin. A linear relationship between gain and gain control may allow for the sum of the Equation 3 and 4 terms to be held constant for the ranges of Vcp and Vcn:

$$Zin \approx \frac{Rf}{1 + Gm \cdot Rload}(Vcp) + \frac{c}{b \cdot Gm}(Vcn) \quad \text{Equation 5}$$
$$Zin \approx \frac{Rf}{1 + Gm \cdot Rload}(Vcp) + \frac{c}{b \cdot Gm}(1 - Vcp)$$

Where Vcp ranges from 1 to 0 and Vcn is complementary to Vcp. Other ranges for Vcp may be possible the range of 1 to 0 is provided as an example. Additionally or alternatively, Vcn may vary over a different range from Vcp. In the example of Equation 5, as Vcp varies across its range, the sum is maintained for cases where:

$$\frac{Rf}{1 + Gm \cdot Rload} = \frac{c}{b \cdot Gm} \quad \text{Equation 6}$$

Figure 7:
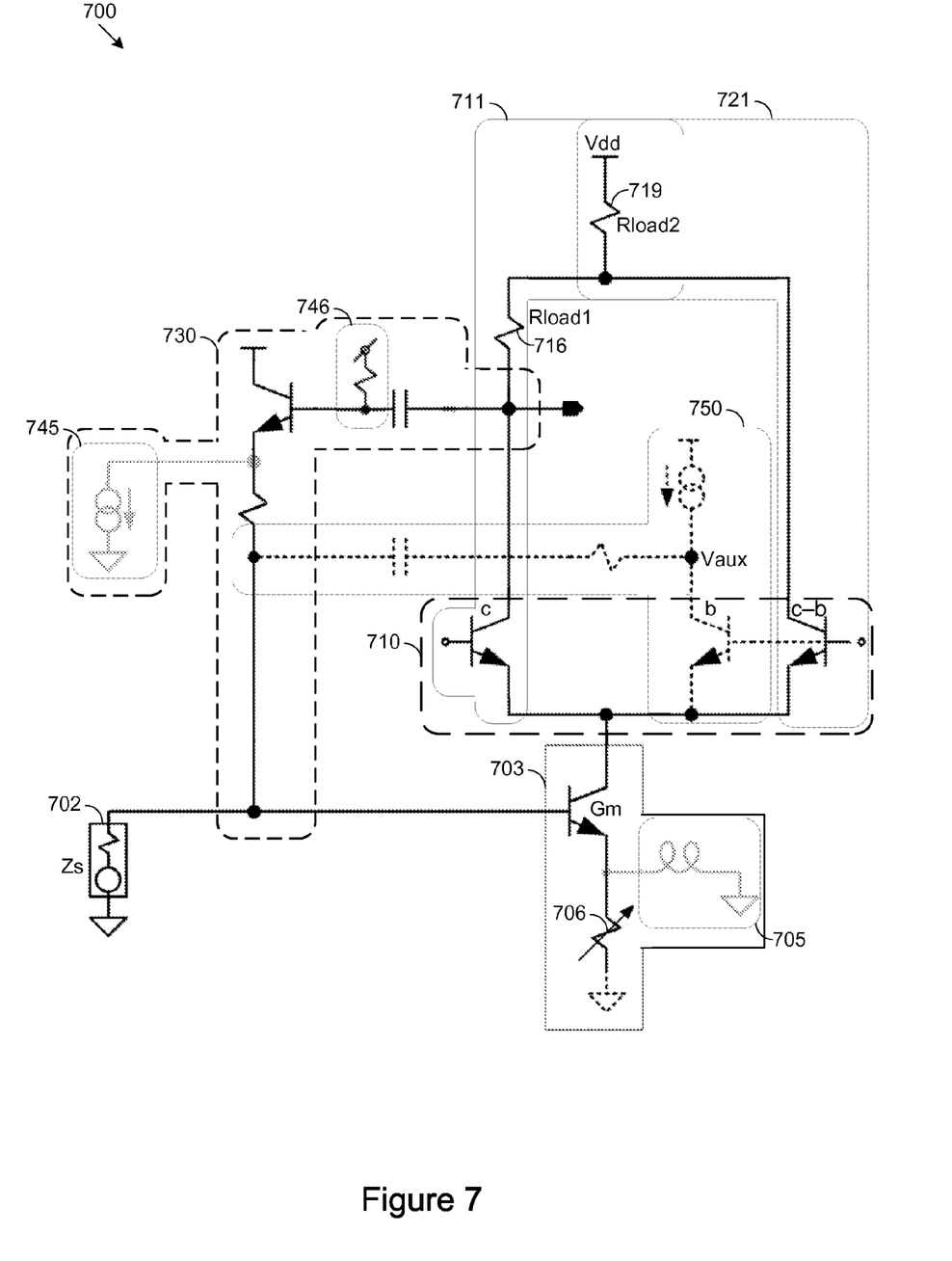

FIG. 7 shows an example AS 700. The example AS 700 is shown in a BJT implementation, and FET or combined BJT/FET implementations may be used. The AS 700 may include an input source 702 with an output impedance Rs. For example, the input source may be an antenna with an associated output impedance. The AS 700 may also include a transconductance circuit 703, a weighting element 710, a feedback loop 730, and an auxiliary loop 750. The transconductance circuit 703 may have a transconductance Gm. Variable resistor 706 may be implemented as an emitter resistor within the transconductance circuit. In some cases, the variable resistor may be implemented with a series of switches to adjust its resistance. For example, metal-oxide semiconductor (MOS) switches may be used. The adjustable resistance may allow the gain of AS 700 to be adjusted in discrete steps. The gain of AS 700 may be adjusted in discrete steps or over a continuous range. Alternatively or additionally, the gain of AS 700 may be adjusted over multiple continuous ranges selectable via discrete tuning of the variable resistor. Bias elements 705, 745, and 746 may be implemented in the transconductance circuit 703 and feedback loop 730. Bias element 705 may be implemented as an inductor or choke. Bias elements 745, 746 may be implemented as current sources. Bias elements 705, 745, and 746 may allow a DC current to flow and may not affect RF currents.

In some implementations, a first load resistor 716 with resistance Rload1 may be placed on path 711. A second load resistor 719 may be placed on paths 711 and 721 before the power supply. In some cases the resistance Rload2 of the second load resistor may be less than or similar to the resistance of variable resistor 706. This may reduce the gain occurring on path 721 and may prevent high voltage from occurring along path 721. The Rload2 may determine a minimum gain for the system. Additionally or alternatively, the Rload2 may determine a maximum sensitivity for the loop gain of the system.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

What is claimed is:

1. A system, comprising:
    a transconductance circuit comprising an input and a first output;
    a weighting element coupled to the first output, the weighting element comprising:
        a first path configured to produce an amplifier output responsive to the first output; and
        a second path configured to split off an auxiliary portion of the first output;
    a feedback loop comprising a variable impedance configured have a dependence on an amplification level of the amplifier output, the feedback loop configured to provide a first portion of the amplifier output as a first feedback to the input responsive to the variable impedance; and
    an auxiliary loop configured to:
        accept the auxiliary portion of the first output; and
        reduce the dependence of the variable impedance responsive to the amplification level by providing, to the input, a second feedback dependent on the amplification level and responsive to the auxiliary portion.

2. The system of claim 1, where the weighting element further comprises a third path configured to split off a second portion of the first output.

3. The system of claim 2, where the weighting element comprises a first transistor for the first path, a second transistor for the second path, and a third transistor for the third path.

4. The system of claim 3, where the first, second and third transistors comprise finger elements.

5. The system of claim 4, where the first transistor comprises a first number of finger elements, the second transistor comprises a second number of finger elements, the third transistor comprises a third number of finger elements; and
    where a difference of the first and third numbers is equal to the second number.

6. The system of claim 4, where the finger elements comprise switchable finger elements;
    where the system further comprises switches for the switchable finger elements to adjust the variable impedance via adjustment of a ratio between the amplifier output and auxiliary portion; and
    where the variable impedance arises from opposing responsivities of the variable impedance and the amplification level dependent feedback.

7. The system of claim 3, where the amplifier output is generated by a first current through the first transistor; and
    where a second current through the third transistor is accepted by a power supply.

8. The system of claim 3, where the first transistor is configured to be controlled by a first control voltage, and the second and third transistors are configured to be controlled by a second control voltage.

9. The system of claim 2, where the amplifier output is configured to increase as the amplification level increases and the second portion and auxiliary portion are configured to decrease as the amplification level increases.

10. The system of claim 1, where the feedback loop is configured to provide the first feedback across a resistive element; and
    the first feedback comprises negative feedback.

11. A method, comprising:
    amplifying a first portion of a first output to generate an amplifier output, the amplifier output related to an input by an amplification level;
    providing, via a feedback loop, a portion of the amplifier output as a first feedback to the input;
    varying a first magnitude of the amplifier output in proportion to the amplification level; providing, via an auxiliary loop, an auxiliary portion of the first output as a second feedback to the input; and
    varying a second magnitude of the second feedback inversely to the amplification level to reduce a dependence of a variable impedance responsive to the amplification level.

12. The method of claim 11, where the varying the second magnitude comprises maintaining a sum of the first and second magnitudes at a value independent of the amplification level.

13. The method of claim 11, further comprising:
    providing a second portion of the first output to a power supply.

14. The method of claim 11, where the providing the portion of the amplifier output comprises providing the portion of the amplifier output across a resistive element.

15. The method of claim 11, further comprising varying the amplification level such that a time-averaged magnitude of the amplifier output is constant.

16. The method of claim 11, further comprising varying the amplification level over a continuous range.

17. A device, comprising:
    a transconductance circuit comprising:
        an input at a first terminal of a transconductance transistor,
        a resistor situated between a ground and a second terminal of the transconductance transistor; and
        a first output at a third terminal of the transconductance transistor, a current between the ground and first output configured to be controlled via the input;
    a weighting element comprising:
        a first transistor, over which a first portion of the first output traverses, the first transistor comprising a first number of finger elements, the first transistor configured to amplify the first portion to generate an amplifier output, the input being related to the amplifier output by an amplification level;
        a second transistor over which a second portion of the first output traverses, the second transistor comprising a second number of finger elements, a difference between the first and second numbers being equal to a third number, a relationship between a first portion magnitude and a second portion magnitude being dependent on the amplification level;
        a third transistor over which an auxiliary portion of the first output traverses, the third transistor comprising the third number of finger elements; and
    a feedback loop configured to provide a portion of the amplifier output across a resistor to serve as a first feedback to the input; and
    an auxiliary loop comprising:
        a path configured to provide a second feedback to the input responsive to the auxiliary portion, the third transistor configured to vary a second feedback magnitude inversely to the amplification level.

18. The device of claim 17, where the amplification level comprises a continuously variable amplification level.

19. The device of claim 18, where the device comprises an amplifier device in an automatic gain control circuit.

20. The device of claim 19, where the amplifier output comprises a constant time-averaged level.

* * * * *